United States Patent [19]

Delight

[11] 4,321,776
[45] Mar. 30, 1982

[54] SHEAR WALL ANCHORING

[75] Inventor: Arthur Delight, Manhattan Beach, Calif.

[73] Assignee: Art Delight Construction, Manhattan Beach, Calif.

[21] Appl. No.: 189,317

[22] Filed: Sep. 22, 1980

[51] Int. Cl.³ .............................. E04B 1/98; E04H 9/02
[52] U.S. Cl. ...................................... 52/167; 52/274; 52/293; 52/295
[58] Field of Search .................... 52/167, 274, 293

[56] References Cited

U.S. PATENT DOCUMENTS

| | | | |
|---|---|---|---|
| 1,290,563 | 1/1919 | James | 52/296 |
| 1,577,629 | 3/1926 | Winge | 52/295 X |
| 2,126,511 | 8/1938 | Soule | 52/274 X |
| 2,260,105 | 10/1941 | Hasenburger et al. | 52/295 X |
| 2,649,625 | 8/1953 | Johnson | 52/295 X |
| 2,654,917 | 10/1953 | Greaves | 52/295 X |
| 2,724,871 | 11/1955 | Levine | 52/293 X |
| 4,127,971 | 12/1978 | Rojo, Jr. | 52/293 X |

OTHER PUBLICATIONS

Engineering News-Record, Mar. 18, 1937, p. 418.

Primary Examiner—Alfred C. Perham
Attorney, Agent, or Firm—Brown, Flick & Peckham

[57] ABSTRACT

A shear wall of a building is tied down to an underlying concrete slab by a single tie rod at each end of the wall. The upper end of each rod is secured to a bracket attached to a shear wall stud, and the lower end of the rod extends through a slot in the upper flange of a channel-like lower bracket. The lower flange is provided with a plurality of slots extending in a common direction and up through which bolts anchored in the concrete foundation extend. The upper slot in this lower bracket extends in a direction at a right angle to the lower slots, and at least one of the several slots extends lengthwise of the shear wall. The slots in the bottom of the lower bracket permit its adjustment on the foundation to position it for receiving the lower end of the rod in the upper slot.

4 Claims, 6 Drawing Figures

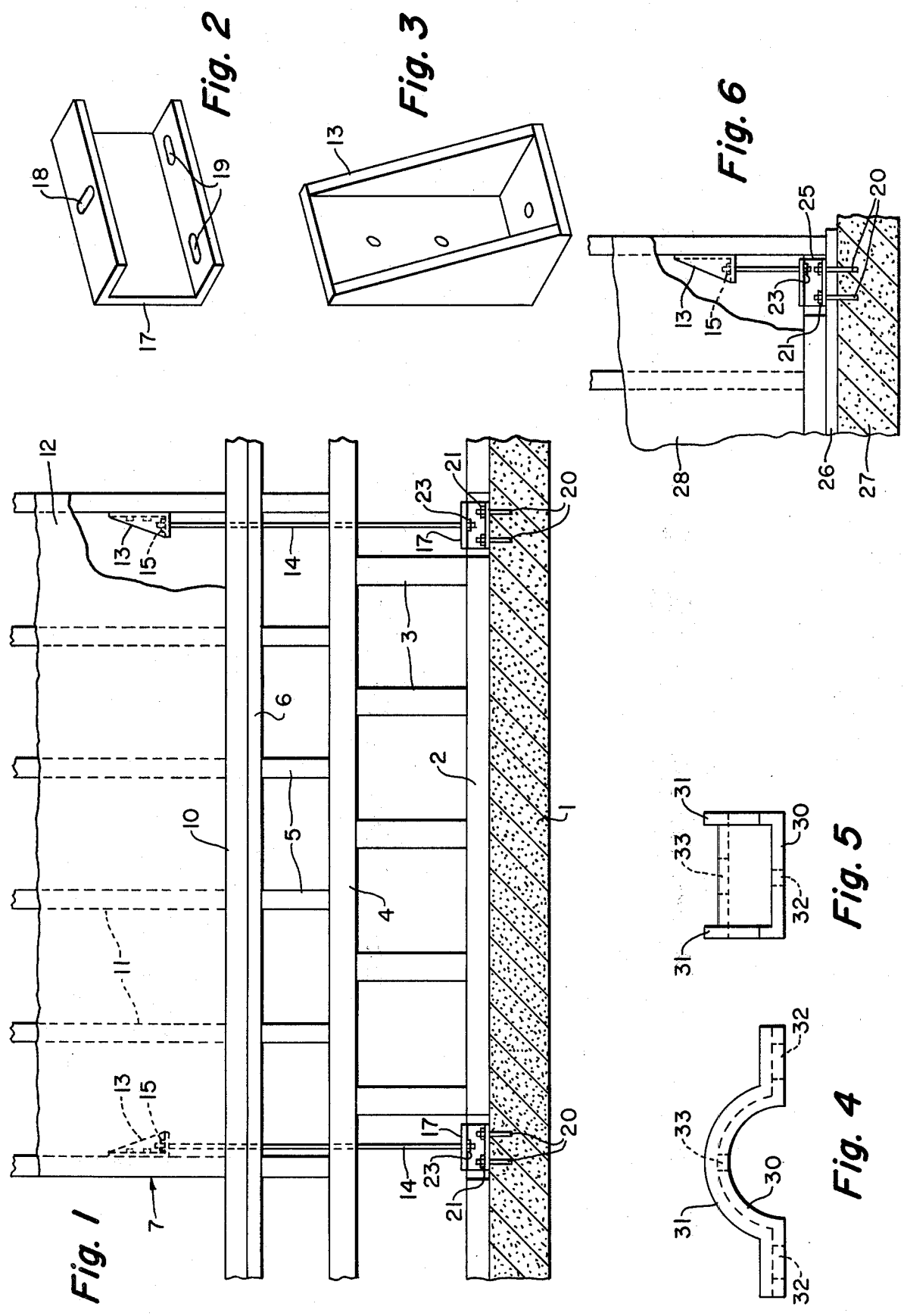

SHEAR WALL ANCHORING

In earthquake zones, such as California, regulations in the building codes are added periodically to reduce danger to property and people when an earthquake occurs. The obvious design goal for a building is to construct it in such a way that it will not collapse in case of an earthquake. One primary way that earthquakes cause buildings to fall is by shaking their foundations sideways. Since inertia tends to keep the roof of a building stationary, the effect of the shaking is to shear the bottom of the building off the top of the building. Walls in a building designed to resist this effect are called shear walls. Wooden building walls include vertical studs, with a stud at each end of the wall. A single rigid diagonal strip extending from the base at one corner stud to the top of the next one will lend stability to the wall. In some parts of the country this is all that is necessary to provide adequate shear resistance, but in California, particularly in multi-story buildings, a solid sheet or sheets of plywood must cover the wall to provide the required shear strength.

However, California now requires more than just good solid shear walls. When the shear wall is more than one story high it is no longer certain that the bottom of the wall will stay firmly on the foundation in case of an earthquake. It may tip on edge. This is especially true when space considerations, such as windows, allow a shear wall to be only two or three feet wide while still being 20 feet or more high. Such a wall is easier to tip on edge when the building is shaken. In case it tips, most of its value as a shear wall is lost. Therefore, to combat this problem, building code regulations now require that the two lower corners of a shear wall be strongly bolted to the foundation.

The conventional way of bolting is to cast threaded vertical tie rods into the foundation when it is poured and later build or slip shear walls over the rods. The upper end of each rod is then anchored to a steel bracket that is attached to one side of an end stud of the wall to tie down the wall. Experience, however, has shown that the threaded rods often are not where they are supposed to be when the shear walls are erected. This may be due to normal tolerances, simple errors or last minute design changes. The rods may be relocated, or originally installed, by drilling holes in the concrete foundation. These holes are located by the carpenter about to construct the wall and so are in the proper locations. Nevertheless, another problem arises, which is that the holding power of the steel rod in the concrete is much less than the strength of the rod. Therefore, large diameter rods must be used to grip the concrete securely. This means that large holes must be drilled, which is very time consuming and therefore expensive. It is much quicker to drill two smaller holes for smaller rods to achieve the necessary holding power, but this requires two threaded rods and two steel brackets for attaching them to the overlying stud. The extra rods and brackets and their installation add several dollars to each tie-down.

It is an object of this invention to provide a shear wall that is securely bolted to the building foundation in a more economical way than heretofore. Another object is to provide a tie-down system in which brackets anchored to the foundation can be adjusted lengthwise and crosswise of the shear wall to positions where the lower ends of the rods can be secured to them.

The preferred embodiment of the invention is illustrated in the accompanying drawings, in which FIG. 1 is a fragmentatry side view of a building with a shear wall;

FIG. 2 is an enlarged perspective view of the lower hold-down bracket;

FIG. 3 is a similar view of the upper bracket;

FIG. 4 is a side view of a modified lower bracket;

FIG. 5 is an end view; and

FIG. 6 is a fragmentary side view of a building with modified construction.

Referring to FIG. 1 of the drawings, the wooden framework of a building rests on a concrete slab 1, on which a plurality of laterally spaced wooden stringers or base plates 2 are laid and to which they are fastened in any suitable manner. At intervals along each base plate there are short vertical posts 3 that support another stringer or cap 4 parallel to the underlying base plate. The space between the caps and base plates forms a crawl space. Seated on the parallel caps are laterally spaced floor joists 5 that support a wooden floor 6. A shear wall 7 is seated on the floor directly above the outermost base plate and cap.

The shear wall includes a horizontal wooden stringer or bottom plate 10 that is nailed to the floor. Supported by this plate at suitable intervals and secured to it are vertical studs 11, the number depending upon the width of the shear wall. One of the studs is seated on each end of the plate. These studs extend upwardly the desired distance and their upper ends are secured to a horizontal stringer (not shown) whereby a rectangular frame is formed. Nailed to the outer side of the frame are boards or panels 12 so that the studs are covered and the shear wall is formed.

It is a feature of this invention that the opposite ends of the shear wall are securely tied down to the concrete slab so that neither end can rise up in case of an earthquake. Accordingly, between the two studs at each end of the shear wall there is a metal bracket 13 that is fastened to the side of the outer stud. This bracket may take different forms, but preferably, as shown in FIG. 3, it has a vertical wall that engages the stud and is bolted to the stud, a horizontal bottom wall and upwardly tapered side walls. All of these walls usually are integral with one another, since the bracket can be a metal casting. The bottom wall of the bracket is provided with a hole through it and other holes aligned with this bracket hole are drilled through the bottom plate 10 of the shear wall, the floor and the underlying cap 4 to receive a vertical tie rod 14 extending through all of these openings. One end of the rod has a head that may be integral with it or be formed by a nut 15 screwed on the threaded upper end of the rod. If the head is at the upper end of the rod it is seated on the bottom of the bracket as shown.

The lower end of the rod is attached to a bracket 17 that is bolted to the concrete slab. This lower bracket is in the form of a short metal channel having upper and lower flanges connected by a vertical web as shown in FIG. 2. A notch is cut in base plate 2 below the upper bracket for receiving the lower bracket. The upper flanges of the bracket is provided with an opening 18 (FIG. 2), through which the rod extends. The lower flange is provided with at least two slots 19 (FIG. 2) extending in a common direction. Two such slots are shown, which extend lengthwise of the shear wall and base plate. Two bolts 20 are anchored in the concrete and extend up through the slots in the bottom of the bracket. The distance between the centers of the bolts is substantially the same as the distance between the centers of slots 19, whereby the bracket can be adjusted lengthwise of the shear wall. Nuts 21 on the upper end of the bolts fasten the bracket securely to the slab. The opening 18 in the upper wall of the lower bracket likewise is a slot, but it extends in a direction at a right angle to the lower slots.

The three slots allow the lower bracket to receive the lower end of the tie rod in the upper slot even though the bolts in the concrete are not positioned as accurately as they should be. Thus, the lower slots permit the bracket to be adjusted lenghthwise in either direction to line up the upper slot with the tie rod, and the upper slot allows for the lower end of the tie rod being located closer to one longitudinal edge of the bracket's upper wall than the opposite edge. When the bracket has been properly located with the rod extending into it, the nuts 21 can be tightened on the bolts that extend through its bottom wall. A nut 23 on the lower end of the rod can serve as a rod head while the nut on the upper end of the rod is tightened in order to pull nut 23 up tightly against the upper wall of the lower bracket, or the nut 23 can be tightened to pull the upper nut 15 down tightly against the upper bracket. With the rod under tension, the adjoining corner of the shear wall is tied down firmly to the concrete slab. Similar brackets and a tie rod are mounted at the oppostie end of the shear wall for tying down that end as shown.

Although the slots in the bottom of the lower bracket have been shown extending lengthwise of the shear wall, which is preferred, it is possible to mount the bracket with the bottom slots extending transversely of the wall and the upper slot extending lengthwise of it.

One big advantange of this tie-down system is that the lower bracket is anchored to the concrete by the holding power of two or more bolts, thereby avoiding the necessity of using a large diameter tie rod or a pair of small diameter tie rods anchored in the concrete.

If the construction of the building is such that the lower bracket cannot be attached to the concrete slab directly below the upper bracket as just described, a bracket 25 can be used in which the upper slot is near one end as shown in FIG. 6. This arrangement is used where the floor 26 is laid directly on a concrete slab 27, with the shear wall 28 supported by the floor. The same adjustments can be made with this bracket as with the one first described.

Another form of lower bracket is illustrated in FIGS. 4 and 5. It consists of an arched plate 30 having upwardly extending side flanges 31 to strengthen it. The end portions of the arch are flat and provided with slots 32 to receive bolts anchored in a concrete slab. Both slots extend in the same direction. The top of the arch is provided with a slot 33 at a right angle to the other slots for receiving the lower end of a tie rod.

According to the provisions of the patent statutes, I have explained the principle of my invention and have illustrated and described what I now consider to represent its best embodiment. However, I desire to have it understood that, within the scope of the appended claims, the invention may be practiced otherwise than as specifically illustrated and described.

I claim:

1. In a building having a concrete foundation supporting a shear wall that includes vertical studs at its ends, an upper bracket secured to one side of each end stud and provided with a vertical hole, a lower bracket on the foundation beneath each upper bracket, the portion of the lower bracket engaging the foundation being provided with a plurality of slots through it extending in a common direction, a plurality of laterally spaced bolts anchored in the concrete foundation and extending up through said slots for securing the lower bracket to the foundation, the centers of said bolts being substantially the same distance apart as the centers of said slots, the lower bracket having a wall spaced above the level of said slots and provided with an upper slot through it extending in a direction at a right angle to the lower slots, at least one of said slots extending lengthwise of the shear wall, a tie rod having its ends extending through said upper bracket hole and the upper slot in the lower bracket, a head on one end of the rod engaging the adjoining bracket, and a nut threaded on the opposite end of the rod and tightly engaging the other bracket to tie down the shear wall, the slots in the bottom of the lower bracket permitting adjustment of that bracket on the foundation to position it for receiving the lower end of said rod in said upper slot.

2. In a building according to claim 1, the lower slots in the lower bracket being spaced lengthwise of said shear wall and extending lengthwise of it.

3. In a building according to claim 1, each lower bracket having vertically spaced horizontal flanges connected by a vertical wall, and said slots being disposed in said flanges.

4. In a building according to claim 1, each lower bracket having spaced end portions engaging said concrete foundation and connected by an arched central portion, said upper slot being disposed in the top of said arched portion.

* * * * *